US012612690B1

(12) United States Patent
Ignatiev

(10) Patent No.: US 12,612,690 B1
(45) Date of Patent: Apr. 28, 2026

(54) METHOD AND SYSTEM FOR VACUUM VAPOR DEPOSITION OF FUNCTIONAL THIN FILM COATINGS ONTO AN ELONGATE SUBSTRATE IN SPACE

(71) Applicant: LUNAR RESOURCES, INC., Houston, TX (US)

(72) Inventor: Alex Ignatiev, Houston, TX (US)

(73) Assignee: Lunar Resources, Inc., Houston, TX (US)

( * ) Notice: Subject to any disclaimer, the term of this patent is extended or adjusted under 35 U.S.C. 154(b) by 645 days.

(21) Appl. No.: 17/729,656

(22) Filed: Apr. 26, 2022

Related U.S. Application Data

(60) Provisional application No. 63/179,714, filed on Apr. 26, 2021.

(51) Int. Cl.
| | |
|---|---|
| *C23C 14/24* | (2006.01) |
| *B64G 1/00* | (2006.01) |
| *C23C 14/06* | (2006.01) |
| *C23C 14/56* | (2006.01) |

(52) U.S. Cl.
CPC .......... *C23C 14/24* (2013.01); *C23C 14/0617* (2013.01); *C23C 14/562* (2013.01)

(58) Field of Classification Search
None
See application file for complete search history.

(56) References Cited

U.S. PATENT DOCUMENTS

| | | | |
|---|---|---|---|
| 3,963,897 A | 6/1976 | Wakita et al. | |
| 4,543,275 A | 9/1985 | Akashi et al. | |
| 4,543,276 A | 9/1985 | Parekh | |
| 4,710,346 A | 12/1987 | Rossman | |
| 4,723,734 A * | 2/1988 | Naumann | B64G 1/66 134/2 |
| 4,724,299 A | 2/1988 | Hammeke | |
| 5,140,939 A | 8/1992 | Valentian | |
| 5,482,003 A | 1/1996 | McKee et al. | |
| 5,779,002 A | 7/1998 | Paton et al. | |
| 5,869,801 A | 2/1999 | Paton et al. | |
| 7,163,179 B1 | 1/2007 | Taylor | |
| 10,052,820 B2 | 8/2018 | Kemmer et al. | |

(Continued)

FOREIGN PATENT DOCUMENTS

| | | | |
|---|---|---|---|
| JP | H0841632 A | 2/1996 | |
| WO | WO-03083454 A1 * | 10/2003 | ......... G01N 21/7703 |

(Continued)

OTHER PUBLICATIONS

United States Patent and Trademark Office, Mail Stop PCT; PCT International Search Report, issued In connection to application No. PCT/US2020/026899; Jul. 2, 2020; 3 pages; U.S.

(Continued)

*Primary Examiner* — Mandy C Louie

(74) *Attorney, Agent, or Firm* — C. Tumey Law Group PLLC

(57) ABSTRACT

A method and system for vacuum vapor deposition of a deposition material to form, a functional thin film coating, upon an elongate substrate, such as an optical fiber or structural member, in space may utilize: a depositor for the deposition material, disposed within a shroud enclosing the substrate as it exits from a space platform.

16 Claims, 5 Drawing Sheets

(56) References Cited

U.S. PATENT DOCUMENTS

| | | | |
|---|---|---|---|
| 2005/0005848 A1 | 1/2005 | Yamazaki et al. | |
| 2005/0022743 A1 | 2/2005 | Sakata et al. | |
| 2005/0066897 A1 | 3/2005 | Pelhos et al. | |
| 2007/0125910 A1 | 6/2007 | Cepollina et al. | |
| 2008/0047607 A1 | 2/2008 | Horsky et al. | |
| 2009/0302503 A1 | 12/2009 | Ruuttu et al. | |
| 2011/0262650 A1 | 10/2011 | Lee | |
| 2012/0009706 A1 | 1/2012 | Choi et al. | |
| 2014/0234551 A1 | 8/2014 | Sparkes et al. | |
| 2014/0316546 A1 | 10/2014 | Walsh et al. | |
| 2015/0284838 A1 | 10/2015 | Marx et al. | |
| 2016/0005897 A1 | 1/2016 | Honda et al. | |
| 2018/0217304 A1 | 8/2018 | Sheikh | |
| 2019/0031552 A1 | 1/2019 | Clawson et al. | |
| 2022/0195589 A1 | 6/2022 | Ignatiev | |

FOREIGN PATENT DOCUMENTS

| | | | |
|---|---|---|---|
| WO | 2020/206435 | 10/2020 | |
| WO | WO-2020206435 A1 * | 10/2020 | ............... B64G 1/66 |

OTHER PUBLICATIONS

United States Patent and Trademark Office, Mail Stop PCT; PCT Written Opinion of the International Searching Authority, issued in connection to application No. PCT/US2020/026899; Jul. 2, 2020; 12 pages; U.S.

The International Bureau of WIPO; PCT International Preliminary Report on Patentability, issued in connection to application No. PCT/US2020/026899; Sep. 28, 2021; 13 pages; Switzerland.

Werner, Debra; Space News: FOMS reports high-quality ZBLAN production on ISS; Nov. 7, 2019; 3 pages.

Japanese Office Action for JP Patent Application No. 2021-560440 dated Jan. 29, 2025. English Translation with Original Untranslated Version, PDF file. 10 pages.

Sheikh, David A. "Battery-powered thin film deposition process for coating telescope mirrors in space." Proceedings of the SPIE Digital Library, vol. 9904, No. 99046J, Jul. 2016. PDF file. 6 pages.

Bunner, Alan. Optical Coating in Space Final Report. Space Science Division of the Perkin-Elmer Corporation, sponsored by the National Aeronautics and Space Administration (NASA), 1983. ER-591. PDF file. 183 pages.

Suita, Y. et al. "Study of gas tungsten arc welding in space (1st Report)." Welding International Journal, vol. 8, No. 4, 1994, pp. 269-273. PDF file. 5 pages.

Agapakis, John et al. "Remotely Manipulated And Autonomous Robotic Welding Fabrication In Space." Proceedings of the SPIE Digital Library, vol. 0580, Space Station Automation, Dec. 1985. PDF file. 11 pages.

Non-Final Office Action Summary for U.S. Appl. No. 17/601,156 dated Jul. 9, 2025. 16 pages.

* cited by examiner

METHOD AND SYSTEM FOR VACUUM VAPOR DEPOSITION OF FUNCTIONAL THIN FILM COATINGS ONTO AN ELONGATE SUBSTRATE IN SPACE

This application claims the benefit, and priority benefit, of U.S. Provisional Patent Application Ser. No. 63/179,714, filed Apr. 26, 2021, the disclosure and content of which is incorporated by reference herein in its entirety.

BACKGROUND OF THE INVENTION

1. Related Application

2. Field of the Disclosure

This disclosure relates generally to the field of vacuum vapor deposition of functional thin film coatings onto an elongate substrate in a space environment.

3. Description of the Related Art

The NASA-sponsored Wake Shield Facility (WSF) program was a free-flying fabrication facility on a disc-shaped spacecraft, deployed from the Space Shuttle in low earth orbit ("LEO") for the growth of epitaxial semiconductor thin films in the vacuum of space. The forward edge of the WSF disk redirected LEO residual atmospheric and other particles around its sides, leaving an "ultra-vacuum" in its wake. The first-ever crystalline semiconductor thin films were grown in this vacuum wake region of space. These included gallium arsenide (GaAs) and aluminum gallium arsenide (AlGaAs) depositions.

BRIEF SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one exemplary embodiment, the system for vacuum vapor deposition of a deposition material in a space environment upon an elongate substrate formed in connection with a space platform may comprise: a shroud having first and second ends with an inner surface enclosing, or partially overlying, a portion of the elongate substrate as the elongate substrate exits from the space platform; at least one depositor for the deposition material, the at least one depositor being disposed within, or beneath, the shroud and having the first end of the shroud disposed adjacent a portion of the space platform, and the shroud is in communication with a vacuum of the space environment; and an energy source associated with the at least one depositor to excite the deposition material to form a vapor of the deposition material which may flow from the at least one depositor to the elongate substrate to coat the elongate substrate with the deposition material, as the elongate substrate exits from the space platform.

In another exemplary embodiment, a method for vacuum vapor deposition of a deposition material in a space environment to form a coating upon an elongate substrate, may comprise: providing a shroud having an inner surface, an outer surface, and first and second ends; providing at least one depositor for the deposition material and disposing the at least one depositor within, or beneath, the shroud; disposing the first end of the shroud adjacent a portion of the space platform, and disposing the shroud in communication with a vacuum of the space environment; providing an energy source associated with the at least one depositor operable to excite the deposition material to form a vapor of the deposition material; and forming the elongate substrate in connection with the space platform and passing the elongate substrate through the shroud while the at least one depositor forms a vapor of the deposition material to coat the elongate substrate with the deposition material.

BRIEF DESCRIPTION OF THE DRAWING

The present method and system for vacuum vapor deposition of functional thin film coatings in space may be understood by reference to the following description taken in conjunction with the accompanying drawing, in which.

Figure 1:
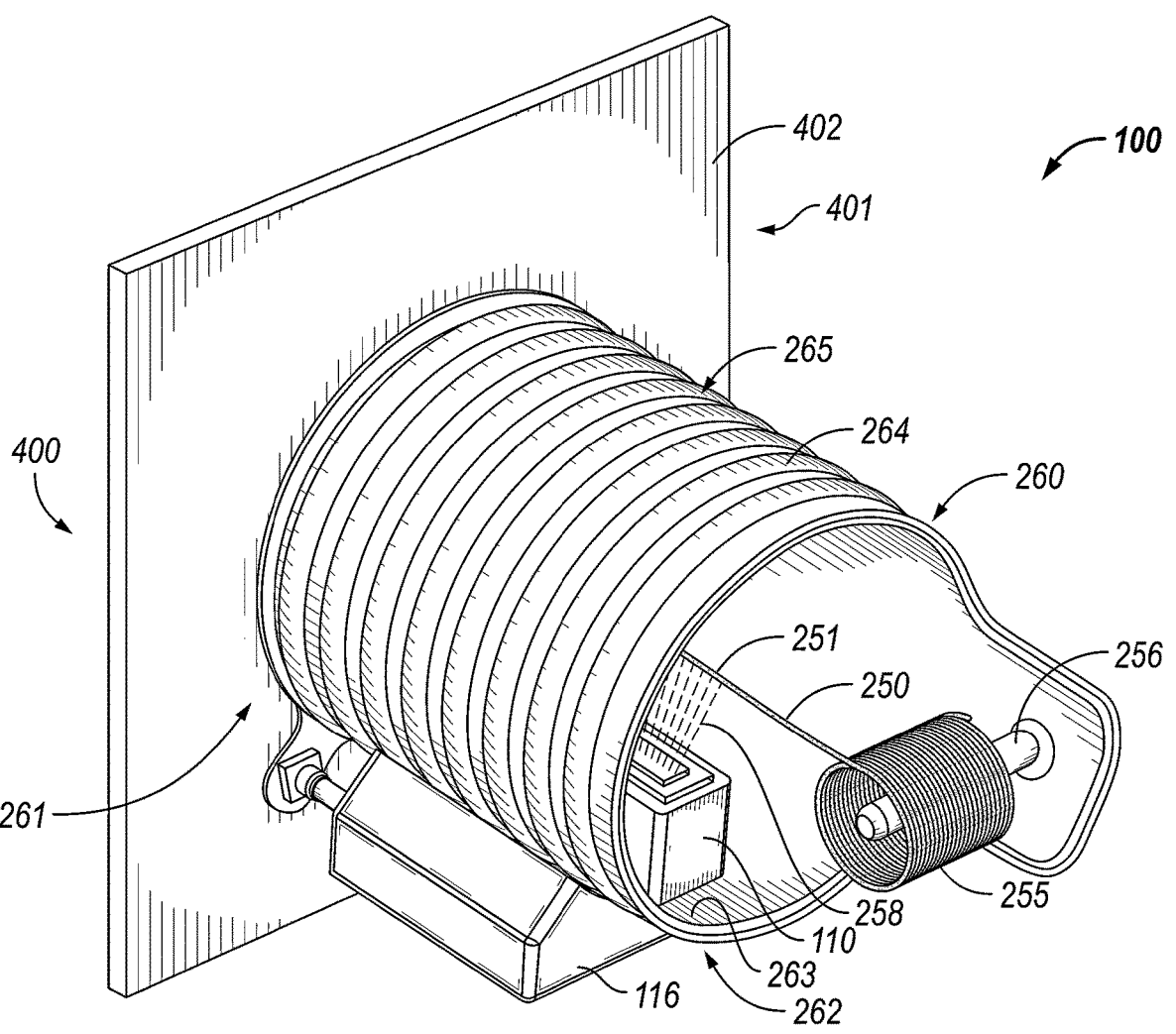
FIG. 1 is a perspective view of a system for vacuum vapor deposition of a deposition material in a space environment upon an elongate substrate in accordance with an illustrative embodiment of the invention.

While certain embodiments of the present method and system for vacuum vapor deposition of functional thin film coatings in space will be described in connection with the present exemplary embodiments shown herein, it will be understood that it is not intended to limit the invention to those embodiments. On the contrary, it is intended to cover all alternatives, modifications, and equivalents, as may be included within the spirit and scope of the invention as defined by the appended claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION OF THE EXEMPLARY EMBODIMENTS

It should be understood that, although an illustrative implementation of one or more exemplary embodiments are provided below, the various specific exemplary embodiments may be implemented using any number of techniques known by persons of ordinary skill in the art. The disclosure should in no way be limited to the exemplary embodiments, drawings, and/or techniques illustrated below, including the exemplary designs and implementations illustrated and described herein. Furthermore, the disclosure may be modified within the scope of the appended claims along with their full scope of equivalents.

Vacuum vapor deposition is a terrestrial manufacturing process used to fabricate functional coatings—reflective, emissive, absorptive, etc. —to produce a variety of products. This process is proposed to be used in the space environment which includes in: free space; a low earth orbit ("LEO"); a sun-synchronous orbit ("SSO"); a medium earth orbit ("MEO"); a geostationary, or geosynchronous, orbit ("GEO"); other earth orbits; and cis-lunar space, as well as on the surface of the moon, or other planetary bodies having reduced atmospheres, such as other moons, asteroids, and other planets, e.g., Mercury, Mars, etc.

A vacuum vapor deposition process may take advantage of the natural vacuum in a space environment to deposit atomically layered materials in the fabrication of a wide variety of functional coatings, thin film materials, and thick film materials. As an example, in the in-space fabrication of optical fibers, such as ZBLAN fibers, coating of the fibers with a metallic thin film coating may be desired. The present system and method can accomplish such coating by the deposition of any number of deposition materials, or different metals, onto the ZBLAN fiber including, but not limited to, Al, Bi, Cu, In, Zn, Cd, etc., as the fiber is being fabricated in the micro-gravity of space.

With reference to FIGS. 1-4, a system 100 for vacuum vapor deposition of a functional thin film coating material in a space environment upon an elongate substrate formed in connection with a space platform in accordance with an illustrative embodiment is shown. An elongate substrate, or optical fiber, 250 may be formed, manufactured, or fabricated, in or on a space platform 400, as will be hereinafter described. Space platform 400 may be a space station, such as the International Space Station, a satellite bus, a spacecraft bus, or a lunar or Mars rover vehicle, a portion of each of these being schematically shown at 401. The deposition system 100 generally includes: a shroud, or housing, 260, associated with the space platform 400; at least one vacuum vapor depositor, or depositor, 110 for the deposition material; and an energy source 113 (FIG. 4), which may generate thermal energy, associated with the at least one depositor, 110. The system 100 may be used in a space environment, including as previously described in free space, LEO, SSO, GEO, in other Earth orbits, CIS-Lunar Space, the Moon or other planetary bodies, all as previously described. The use of the term "elongate substrate" is meant to include and describe any elongated component, such as an optical fiber 250, which generally is longer than its width, as well as any other elongated component, such as a structural member, such as an I-beam or strut, or combination of elongated components, such as a truss, which have the requisite characteristics of length being significantly larger than width.

Depositor 110 may be any device or equipment that can deposit a deposition material upon a substrate by a vacuum vapor deposition process or any other deposition process herein described. The depositor, 110 of system 100 has a power source 111 associated with it, feeding energy to the depositor 110 to provide energy to the depositor 110 to excite the deposition material disposed within the depositor 110 to form a vapor, or flux, 258 (FIG. 4), of the deposition material. Power source 111 may be an umbilical connector 115 disposed between the space platform 400 and the depositor 110, through which power, such as electric power, may travel from the space platform 400 to the depositor 110.

If desired, power source 111 may be one or more batteries (not shown) which may be mounted on, or near, depositor 110. Additionally, data and control signals for the depositor 110 could also be supplied to the depositor 110 through umbilical connector 115, or another umbilical connector, not shown.

Figure 2:
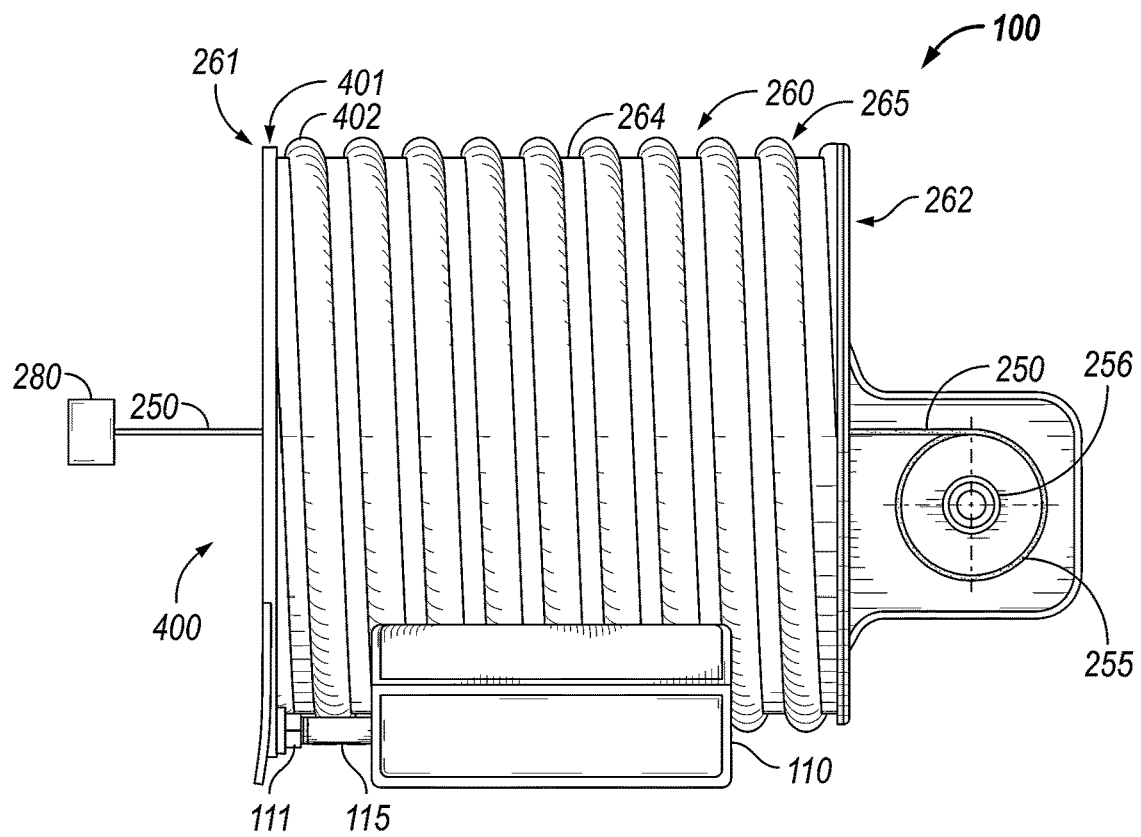
FIG. 2 is a side elevation view of the system of FIG. 1.
Figure 3:
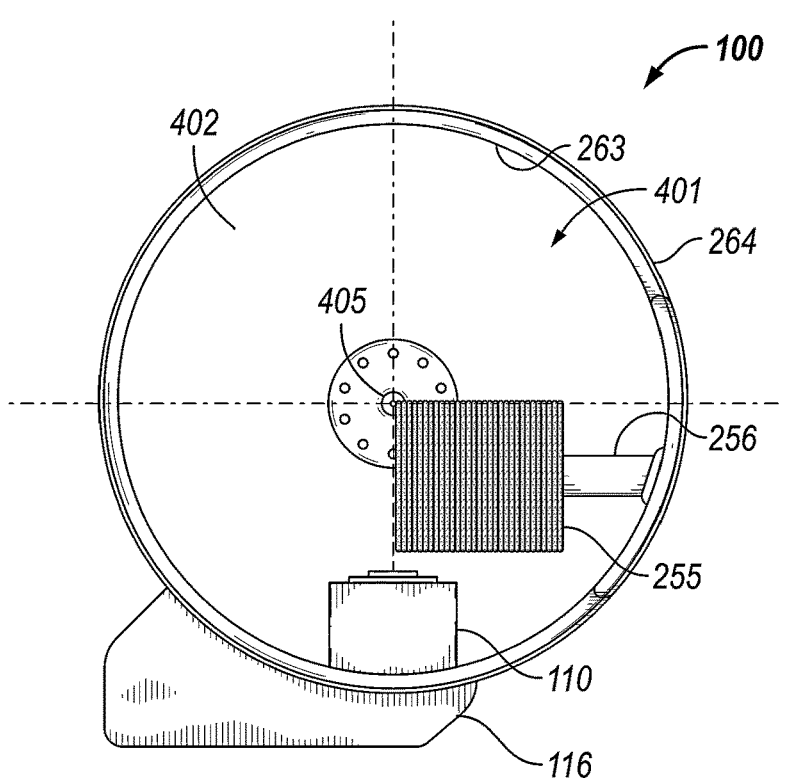
FIG. 3 is an end view of the system of FIG. 1.
Figure 4:
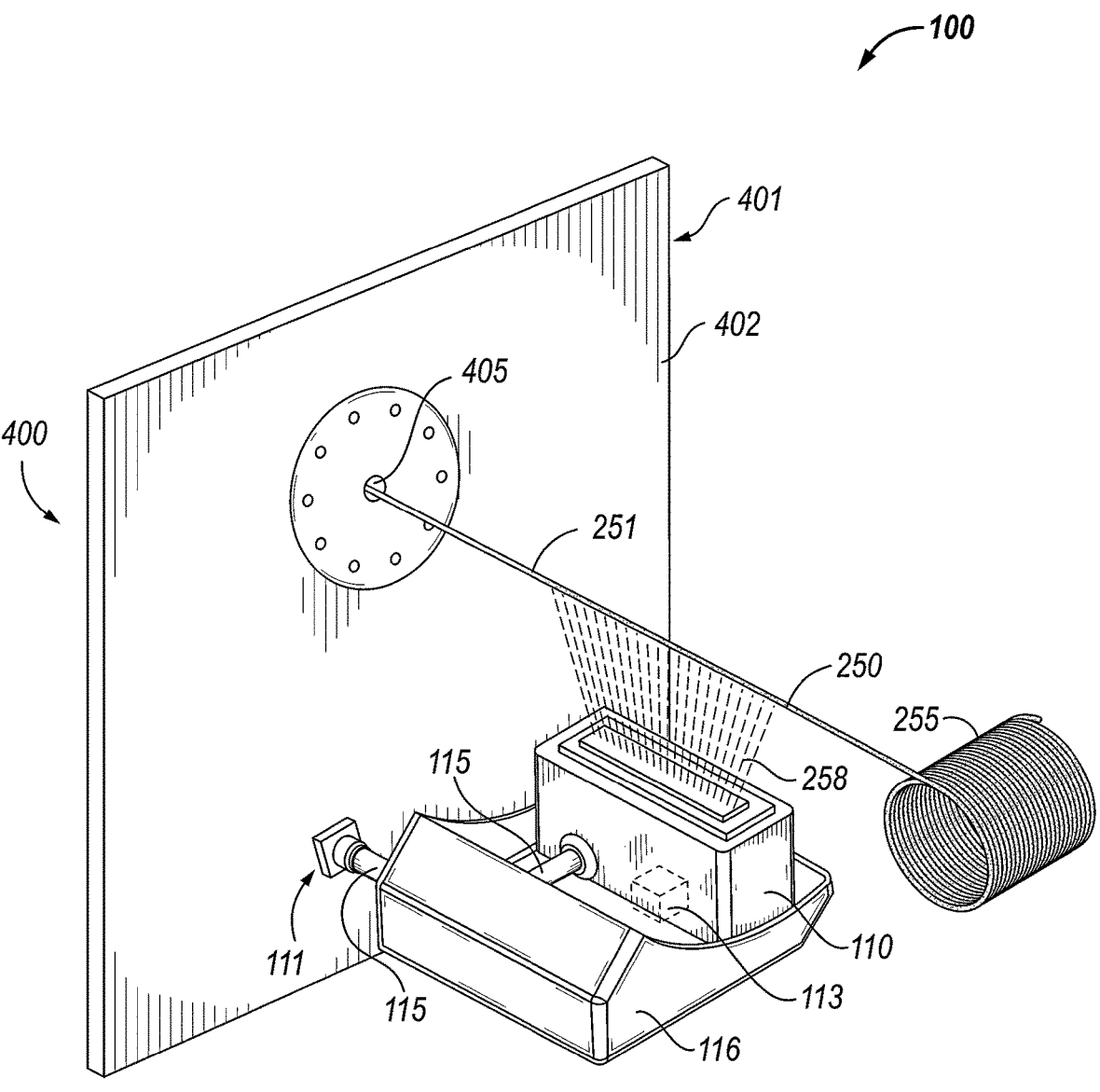
FIG. 4 is a perspective view of a portion of the system of FIG. 1.

Elongate substrate, or fiber, 250 may be formed, fabricated, or manufactured, in connection with the space platform 400, as by extruding, or drawing, the fiber 250 in or on the space platform 400 with an extruder 280 schematically shown in FIG. 2 within the space platform 400. Other types of equipment and/or processes could be utilized to form, manufacture, or fabricate the fiber 250. A portion, or outer wall, 402 of the space platform 400 is illustrated in FIGS. 1-4. The elongate substrate, or fiber, 250 may be an optical fiber, such as a ZBLAN optical fiber; however, the present system 100 may be used to coat other fibers or elongate substrates, if desired. As elongate substrate, or fiber 250 is formed it exits the outer wall 402 of the space platform 400 through an exit orifice, or opening, 405 (FIGS. 3 and 4) and enters the shroud, or housing, 260. The portion, or outer wall, 402 of the space platform 400, could also be a wall of a separate container or housing associated with, on, or inside, the space platform 400, which container, or housing, houses the optical fiber forming equipment, such as extruder 280. For drawing clarity shroud 260 is not shown in FIG. 4.

Still with reference to FIGS. 1-4, the shroud, or housing, 260 of system 100 preferably has a cylindrical cross-sectional configuration, or any other cross-sectional configuration, such as a square, rectangular, or oval cross-sectional configuration that permits and provides the desired functions of shroud 260. Shroud 260 has: first and second ends 261, 262; an inner, or inner wall, surface 263; and an outer, or outer wall, surface 264. As the elongate substrate, or fiber, 250 exits the space platform 400, via opening, or orifice, 405 in outer wall 402 of the space platform 400, a portion 251 of fiber 250 is enclosed, or surrounded, by the inner, or inner wall, surface 263 of shroud 260. As the fiber 250 exits the shroud 260 from its second end 262, the fiber 250 may be collected upon a rotatable reel, or spool, 255, or other suitable device, which may be associated with a shaft 256, associated with the second end 262 of shroud 260. The first end 261 of shroud 260 is associated with space platform 400 as by being abutted against, disposed adjacent, or attached to the outer wall portion 402 of space platform 400. The second end 262 of shroud 260 is open and in communication with a vacuum of the space environment.

The outer, or outer wall, surface 264 of shroud 260 may include a thermal radiator 265 which removes, or extracts, heat generated within the shroud 260 by the depositor 110 and the energy source 113 during deposition of a coating upon the elongate substrate, or fiber, 250. The thermal radiator 265 radiates that heat to the space environment. The shroud 260 may also include a vacuum environment measurement gauge, or sensor, such as gauge 130 and a vapor, or flux, measurement sensor, or device such as 120 both of which are hereinafter described and shown in connection with FIGS. 6-8, as well as a hardware/software-based control system to support control of the depositor process. The shroud 260 in enclosing, or surrounding, the depositor 110 functions to protect the space platform 400, or other structures or vehicles, such as a space station, a satellite bus, or a spacecraft bus, from being coated by the depositor 110 during the deposition process.

Still with reference to FIGS. 1-4, at least one depositor 100 is disposed within shroud 260 to form a coating upon the elongate substrate, or fiber, 250 by a vapor, or flux, 258 of a deposition material through which the elongate substrate, or fiber, 250 passes as the fiber 250 travels through shroud 260. The depositor 110 may include a depositor container, or housing, 116 which supports depositor 110 within the shroud 260. If desired additional depositors 100 could be radially disposed within the shroud to ensure that all of the outer surface area of the fiber 250 is coated.

Figure 5:
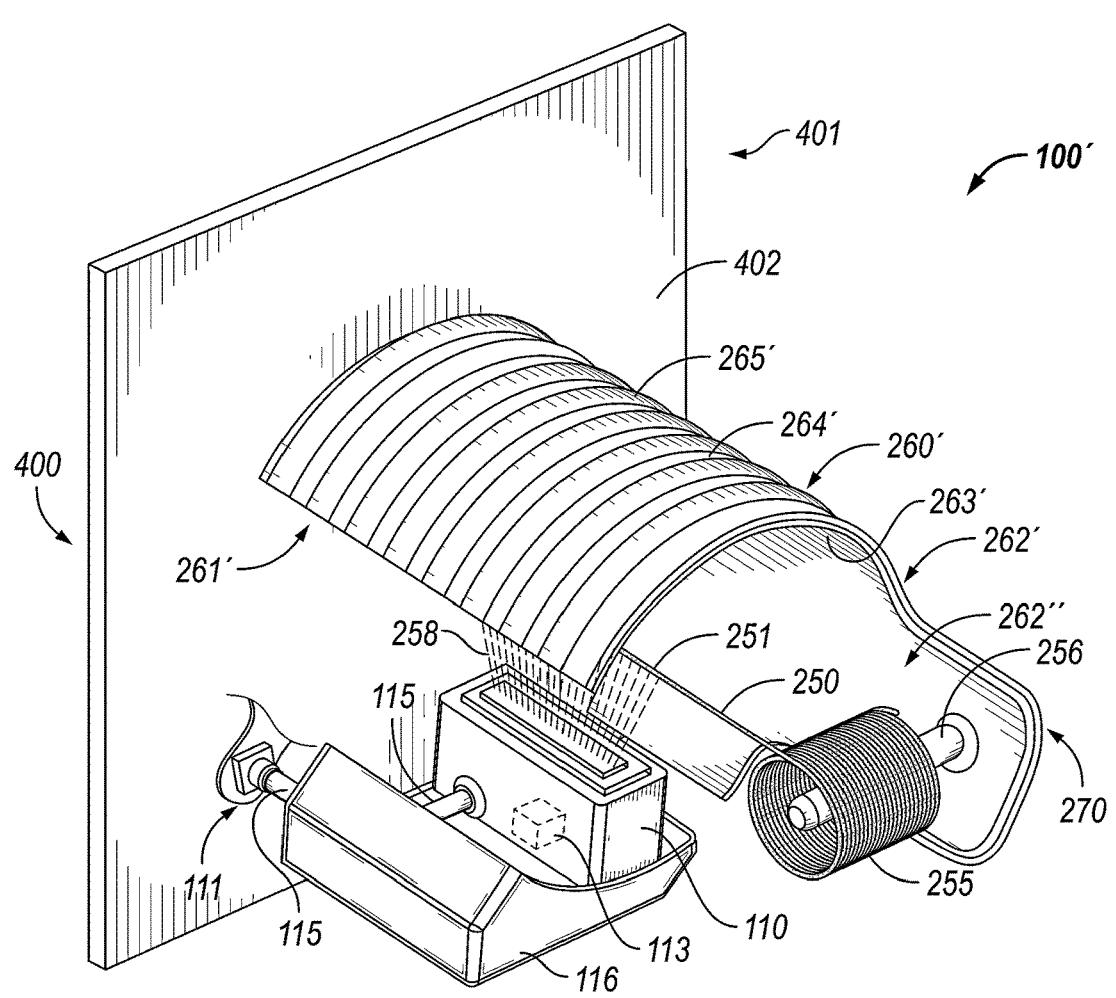
FIG. 5 is a perspective view of a system for vacuum vapor deposition of a deposition material in a space environment upon an elongate substrate in accordance with another illustrative embodiment of the invention.

With reference to FIG. 5, a system 100' for vacuum deposition of a functional thin film coating material in a space environment upon an elongate substrate formed in a space platform in accordance with an illustrative embodiment is shown. An elongate substrate, or optical fiber, 250 may be formed, or fabricated, in connection with a space platform 400, as previously described. Space platform 400 may be a space station, such as the International Space Station, a satellite bus, a spacecraft bus, or a lunar or Mars rover vehicle, a portion of each of these being schematically shown at 401. The deposition system 100' generally includes: a shroud, or housing, 260', associated with the space platform 400; at least one vacuum vapor depositor, or depositor, 110 for the deposition material; and an energy source 113, which may generate thermal energy, associated with the at least one depositor, 110. The system 100' may be used in a space environment, including as previously described in free space, LEO, SSO, GEO, in other Earth orbits, CIS-Lunar Space, the Moon or other planetary bodies, all as previously described. The use of the term "elongate substrate" is meant to include and describe any elongated component, such as an optical fiber 250 which generally is longer than its width, as well as any other elongated component, such as an I-beam or strut, or combination of elongated components, such as a truss, which have the requisite characteristics of length being significantly larger than width.

Depositor 110 may be any device or equipment that can deposit a deposition material upon a substrate by a vacuum vapor deposition process or any other deposition process herein described. The depositor, 110 of system 100' has a power source 111 associated with it, feeding energy to the depositor 110 to provide energy to the depositor 110 to excite the deposition material disposed within the depositor 110 to form a vapor, or flux, 258, of the deposition material. Power source 111 may be an umbilical connector 115 disposed between the space platform 400 and the depositor 110, through which power, such as electric power, may travel from the space platform 400 to the depositor 110. If desired, power source 111 may be one or more batteries, which may be mounted on, or near, depositor 110. Additionally, data and control signals for the depositor 110 could also be supplied to the depositor 110 through umbilical connector 115, or another umbilical connector, not shown.

Elongate substrate, or fiber, 250 may be formed, fabricated, or manufactured, in connection with the space platform 400, as by extruding, or drawing, the fiber 250 in or on the space platform 400 with an extruder 280 as schematically shown in FIG. 2 within the space platform 400. Other types of equipment and/or processes could be utilized to form, manufacture, or fabricate the fiber 250. A portion, or outer wall, 402 of the space platform 400 is illustrated in FIG. 5. The elongate substrate, or fiber, 250 may be an optical fiber, such as a ZBLAN optical fiber; however, the present system 100' may be used to coat other fibers or elongate substrates, if desired. As elongate substrate, or fiber 250 is formed it exits the outer wall 402 of the space platform 400 through an exit orifice, or opening, 405 (FIG. 3) and enters, or passes beneath, the shroud, or housing, 260'. The portion, or outer wall, 402 of the space platform, could also be a wall of a separate container or housing associated with, or inside, the space platform, which container, or housing, houses the optical fiber forming equipment, such as extruder 280.

Still with reference to FIG. 5, the shroud, or housing, 260' of system 100' has a curved, or partially semi-circular, cross-sectional configuration, or any other cross-sectional configuration that permits and provides the desired functions of shroud 260' such as a substantially flat planar, or a partially oval cross-sectional configuration. Shroud 260' has: first and second ends 261', 262'; an inner, or inner wall, surface 263'; and an outer, or outer wall, surface 264'. As the elongate substrate, or fiber, 250 exits the space platform 400, via opening, or orifice, 405 in outer wall 402 of the space platform 400, a portion 251 of fiber 250 is partially enclosed, surrounded or overlied, by the inner, or inner wall, surface 263' of shroud 260'. As the fiber 250 exits the shroud 260' from its second end 262', the fiber 250 may be collected upon a rotatable reel, or spool, 255, or other suitable device, which may be associated with a shaft 256, associated with an extension 262" of the second end 262' of shroud 260'. The first end 261' of shroud 260' is closed, as by a mating curved shaped wall (not shown) at the first end 261' or by being abutted against, or disposed adjacent, the outer wall portion 402 of space platform 400 in a sealed relationship. The second end 262' of shroud 260' is open and in communication with a vacuum of the space environment. Alternatively spool 255 and shaft 256 may be separately supported by another support member associated with space platform 400.

The outer, or outer wall, surface 264' of shroud 260' may include a thermal radiator 265' which removes, or extracts, heat generated within the shroud 260' by the depositor 110 and the energy source 113 during deposition of a coating upon the elongate substrate, or fiber, 250. The thermal radiator 265' radiates that heat to the space environment. The shroud 260' may also include a vacuum environment measurement gauge, or sensor, such as gauge 130 and a vapor, or flux, measurement sensor, or device such as 120 both of which are hereinafter described and shown in connection with FIGS. 6-8, as well as a hardware/software-based control system to support control of the depositor process. The shroud 260', in partially enclosing, surrounding, or overlying the depositor 110 functions to protect the space platform 400, or other structures or vehicles, such as a space station, a satellite bus, a spacecraft bus, or a lunar or Mars rover vehicle from being coated by the at least one depositor 110 during the deposition process.

Still with reference to FIG. 5, at least one depositor 100 is disposed beneath shroud 260' to form a coating upon the elongate substrate, or fiber, 250 by a vapor, or flux, 258 of a deposition material through which the elongate substrate, or fiber, 250 passes as the fiber 250 passes under shroud 260'. The depositor 110 may include a depositor container, or housing, 116 which supports depositor 110 within the shroud 260'. If desired additional depositors 100 could be radially or longitudinally disposed beneath the shroud 260' to ensure that all of the outer surface area of the fiber 250 is coated.

The system 100 of FIGS. 1-4 and the system 100' of FIG. 5 for vacuum vapor deposition of a deposition material upon an elongate substrate, or fiber, 250 may utilize different vacuum vapor deposition processes as are known in the art. The vapor of the deposition material may be formed by such deposition processes as thermal evaporation, ion-beam evaporation, electron beam evaporation, laser deposition, or other physical vacuum vapor deposition processes. The deposition may also be accomplished, if desired, by chemical deposition, including chemical vapor deposition, metal organic chemical vapor deposition, metal organic deposition, or other chemical vapor deposition processes.

Figure 6:
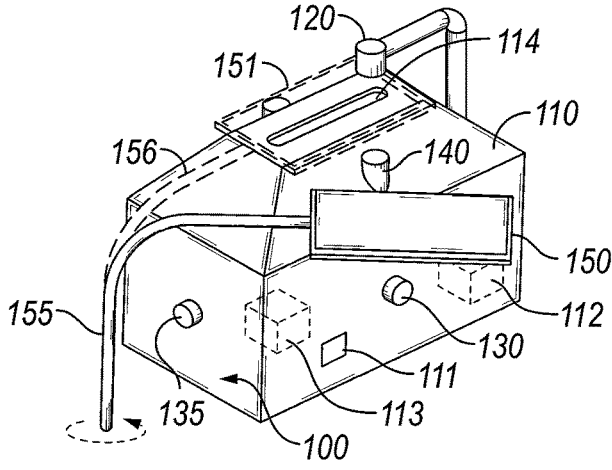
FIG. 6 is a perspective view of a portion of the systems for vacuum vapor deposition of FIGS. 1 and 5.

With reference to FIG. 6, the system 100 of FIGS. 1-4 and system 100' of FIG. 5 for vacuum vapor deposition of the deposition material may utilize a thermal evaporation process. In FIG. 6, the depositor 110, includes a boat, or container, disposed within the depositor, as shown schematically at 112, which is nominally inert to the coating or deposition material and holds the deposition material. The depositor 110 includes an energy source 113 disposed within, or associated with, the depositor, as shown schematically in FIG. 5, to heat the container 112 to cause a vapor of the deposition material to be formed. The energy source 113 may be a resistive heat source which provides Joule heating or resistive heating, to the housing, or boat, 112. Energy source 113 could also be a laser or microwave heat source, or any other heating technique that can heat the boat, or container, 112 to evaporate, or vaporize, the deposition material to provide the desired vapor of deposition material to be applied to the elongate substrate, or fiber, 250. As to the systems 100 and 100', energy source 113 may receive its necessary power requirements from the power source 111. As to the systems 100 and 100' of FIGS. 5 and 6, the energy source 113 for the depositor 110 mounted to, or associated with, the space platform 400 may receive its necessary power directly from space platform 400, or from the power source 111.

The depositor 110 may be provided with a device or sensor, 120 to measure the flow of the vapor, or flux, 258 of deposition material from the container, or boat, 112 inside depositor 110. A camera 140 may be associated with the depositor 110 to monitor the flow of the vapor of deposition material to the elongate substrate, or fiber, 250 and to monitor the depositor 110 with respect to the elongate substrate, or fiber, 250. A vacuum environment measurement gauge 130 may also be associated with the depositor 110 to measure the vacuum of the space environment proximate the system 100. Systems 100 and 100' may also include a coating, or material, performance characteristic measurement device 135, associated with the depositor 110.

Still with reference to FIG. 6, the vapor of the deposition material formed by the heating of the boat, or container, 112 inside depositor 110, exits the depositor 110 via an opening, or slot, 114, formed in the upper end of the depositor 110. Depositor 110 may have a shutter or plate member 150, and the shutter 150 is moveable from a first open position, wherein the vapor of the deposition material may flow from the container or boat 112 inside the depositor 110 to the elongate substrate, or fiber, 250, to a second closed position, wherein the shutter 150 blocks the flow of the vapor from the depositor 110 to the substrate 250. The shutter 150 may be associated with, or attached to, a shutter control arm, or control system, 155, and the rotation of the shutter control arm, or control system, 155 moves the shutter 150 to and from the first and second positions. In FIG. 6, the shutter 150 is in the closed second position as noted by reference numeral 151, wherein the shutter 150 blocks the flow of the vapor of the deposition material from the depositor 110. The first open position of the shutter is also shown in FIG. 6. Systems 100 and 100' may also include appropriate electronic equipment to control and provide the energy for the energy source 113 and for the control of camera 140, shutter 150, and vacuum environment measurement gauge 130.

Figure 7:
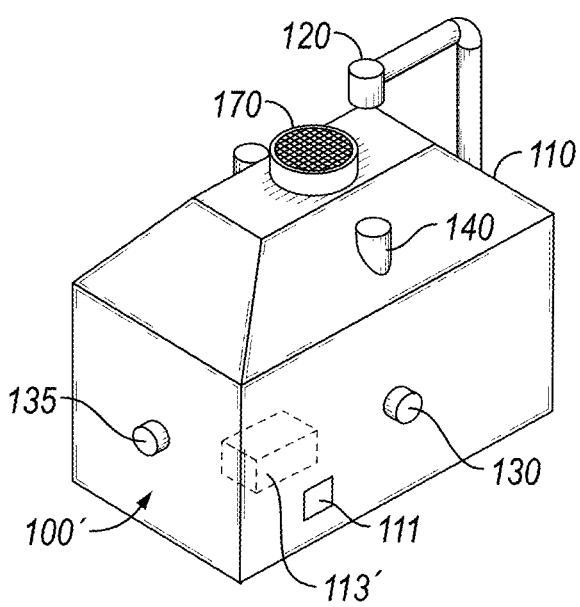
FIG. 7 is a perspective view of a portion of another embodiment of the systems for vacuum vapor deposition of FIGS. 1 and 5.

With reference to FIG. 7, the depositor 110' of systems 100 and 100' may utilize an ion-beam evaporation process to form the vapor of the deposition material. This ion-beam or sputter deposition process utilizes a sputter source 170, associated with the depositor 110' which provides the vapor of the deposition material to be applied to the substrate 250. Depositor 110' may include the vapor, or flux, measurement sensor, or device, 120, camera 140, vacuum environment measurement gauge 130 and performance characteristic measurement device 135, as previously described in connection with the depositor 110 of FIG. 6. If desired, a shutter 150 (FIG. 6), may also be utilized with depositor 110' of FIG. 7. An energy source 113' shown schematically in FIG. 7 may be disposed within, or associated with, depositor 110' and may receive its necessary power in the same manner as described in connection with energy source 113 of FIG. 6.

Figure 8:
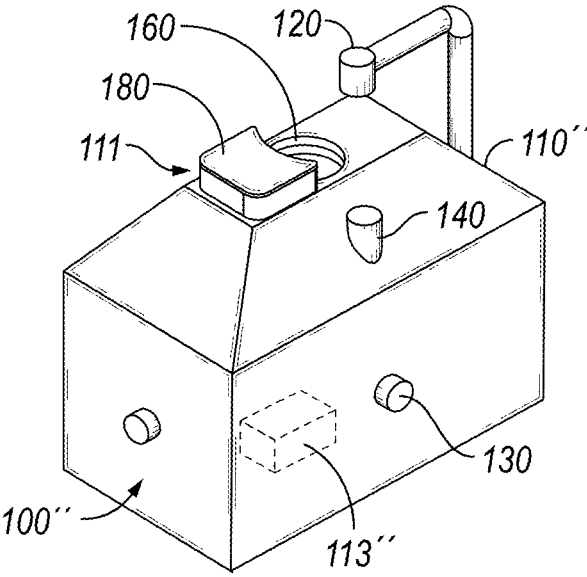
FIG. 8 is a perspective view of another embodiment of a portion of the system for vacuum vapor deposition of FIGS. 1 and 5.

With reference to FIG. 8, an electron beam evaporation process may be used with depositor 110" of systems 100 and 100' to form the vapor of the deposition material to be applied to substrate 250. Depositor 110" is provided with an electron gun housing 180 for the electron gun that forms the electron beam which evaporates the deposition material. The electron beam is directed to a crucible shown schematically at 160, in the depositor 110". The depositor 110" of FIG. 8 may also include the other previously described components, vapor, or flux, measurement sensor 120, camera 140, vacuum environment measurement gauge 130, and coating performance characteristic measurement device 135. Similarly, depositor 110" may include the shutter 150 of the depositor 110 of FIG. 6. An energy source 113" shown schematically in FIG. 8 in, or associated with, depositor 110" may receive its necessary power in the same manner as described in connection with energy source 113 of FIG. 6.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure.

Use of the terms "optionally" or "preferably" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above, but is defined by the claims that follow, that scope including all equivalents of the subject matter of the claims. Each and every claim is incorporated as further disclosure into the specification and the claims are embodiment(s) of the present disclosure.

While several exemplary embodiments have been provided in the present disclosure, it may be understood that the disclosed embodiments might be embodied in many other specific forms without departing from the spirit or scope of the present disclosure and the appended claims. The present examples are to be considered as illustrative and not restrictive, and the intention is not to be limited to the details given herein. For example, the various elements or components may be combined or integrated in another system or certain features may be omitted, or not implemented.

In addition, the various exemplary embodiments described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

I claim:

1. A method for vacuum vapor deposition of a deposition material in a space environment to form a coating upon an elongate substrate, comprising:

providing a shroud having an inner surface, an outer surface, and first and second ends;

providing at least one depositor for the deposition material and disposing the at least one depositor within the shroud;

disposing the first end of the shroud adjacent a portion of a space platform, and disposing the shroud in communication with a vacuum of the space environment;

providing an energy source associated with the at least one depositor operable to excite the deposition material to form a vapor of the deposition material; and forming the elongate substrate in connection with the space platform and passing the elongate substrate through the shroud while the at least one depositor forms a vapor of the deposition material to coat the elongate substrate with the deposition material.

2. The method of claim 1, wherein the elongate substrate is a structural member.

3. The method of claim 1, wherein the elongate substrate is an optical fiber.

4. The method of claim 3, wherein the optical fiber is a ZBLAN fiber.

5. The method of claim 1, including utilizing a resistive heat source as the energy source.

6. The method of claim 1, including utilizing a laser as the energy source.

7. The method of claim 1, including utilizing an electron beam as the energy source.

8. The method of claim 1, including utilizing an ion beam as the energy source.

9. The method of claim 1 including providing the outer surface of the shroud with a thermal radiator which removes heat generated within the shroud by the at least one depositor and the energy source, and radiates the heat to the vacuum of the space environment.

10. The method of claim 1, including utilizing a spacecraft bus as the space platform.

11. The method of claim 1, including utilizing a space station as the space platform.

12. The method of claim 1, including utilizing a rover vehicle as the space platform.

13. The method of claim 1, wherein the second end of the shroud is open.

14. The method of claim 1, including utilizing a satellite bus as the space platform.

15. A method for vacuum vapor deposition of a deposition material in a space environment to form a coating upon an elongate substrate, comprising:

providing a shroud having an inner surface, an outer surface, and first and second ends;

providing at least one depositor for the deposition material and disposing the at least one depositor beneath the shroud;

disposing the first end of the shroud adjacent a portion of a space platform, and disposing the shroud in communication with a vacuum of the space environment;

providing an energy source associated with the at least one depositor operable to excite the deposition material to form a vapor of the deposition material; and forming the elongate substrate in connection with the space platform and passing the elongate substrate through the shroud with the inner surface of the shroud partially overlying a portion of the elongate substrate while the at least one depositor forms a vapor of the deposition material to coat the elongate substrate with the deposition material.

16. The method of claim 15 including providing the outer surface of the shroud with a thermal radiator which removes heat generated beneath the shroud by the at least one depositor and the energy source, and radiates the heat to the vacuum of the space environment.

* * * * *